United States Patent
Song et al.

(10) Patent No.: US 11,367,792 B2
(45) Date of Patent: Jun. 21, 2022

(54) THIN FILM TRANSISTOR, FABRICATING METHOD THEREOF, AND DISPLAY APPARATUS

(71) Applicants: HEFEI XINSHENG OPTOELECTRONICS TECHNOLOGY CO., LTD., Anhui (CN); BOE Technology Group Co., Ltd., Beijing (CN)

(72) Inventors: Wei Song, Beijing (CN); Liangchen Yan, Beijing (CN); Ce Zhao, Beijing (CN); Heekyu Kim, Beijing (CN); Yuankui Ding, Beijing (CN); Leilei Cheng, Beijing (CN); Yingbin Hu, Beijing (CN); Wei Li, Beijing (CN); Guangyao Li, Beijing (CN); Qinghe Wang, Beijing (CN)

(73) Assignees: HEFEI XINSHENG OPTOELECTRONICS TECHNOLOGY CO., LTD, Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/971,085

(22) PCT Filed: Nov. 1, 2019

(86) PCT No.: PCT/CN2019/115088
§ 371 (c)(1),
(2) Date: Aug. 19, 2020

(87) PCT Pub. No.: WO2021/081992
PCT Pub. Date: May 6, 2021

(65) Prior Publication Data
US 2021/0135012 A1    May 6, 2021

(51) Int. Cl.
*H01L 21/00* (2006.01)
*H01L 27/00* (2006.01)
(Continued)

(52) U.S. Cl.
CPC .. *H01L 29/78633* (2013.01); *H01L 21/02592* (2013.01); *H01L 21/02631* (2013.01);
(Continued)

(58) Field of Classification Search
CPC ......... H01L 21/02592; H01L 21/02631; H01L 21/283; H01L 21/32133; H01L 21/28079;
(Continued)

(56) References Cited

U.S. PATENT DOCUMENTS 6,583,440 B2 *  6/2003  Yasukawa ......... H01L 21/76254
                                                        257/59
7,078,274 B2 *  7/2006  Yamada .............. H01L 27/1281
                                                        438/149
(Continued)

FOREIGN PATENT DOCUMENTS

CA      3005671 A1    5/2017
CN      103191791 A   7/2013
(Continued)

OTHER PUBLICATIONS

Sze, Semiconductor Devices, 2002, pp. 186-188, John Willey & Sons, New York. (Year: 2002).*
(Continued)

*Primary Examiner* — Nikolay K Yushin
(74) *Attorney, Agent, or Firm* — WHDA, LLP (57) ABSTRACT

The present disclosure is related to a thin film transistor. The thin film transistor may include an active layer; a gate insulating layer on the active layer; and a gate and a plurality of metal films on the gate insulating layer. The plurality of
(Continued)

metal films may be spaced apart from the gate, and insulated from the gate and the active layer.

17 Claims, 6 Drawing Sheets (51) Int. Cl.
    *H01L 29/00*     (2006.01)
    *H01L 29/786*     (2006.01)
    *H01L 27/12*     (2006.01)
    *H01L 29/24*     (2006.01)
    *H01L 21/02*     (2006.01)
    *H01L 29/66*     (2006.01)
    *H01L 27/32*     (2006.01)

(52) U.S. Cl.
    CPC ........ *H01L 27/127* (2013.01); *H01L 27/1225* (2013.01); *H01L 27/1288* (2013.01); *H01L 29/24* (2013.01); *H01L 29/66969* (2013.01); *H01L 29/7869* (2013.01); *H01L 27/3262* (2013.01); *H01L 27/3272* (2013.01)

(58) Field of Classification Search
    CPC ............... H01L 27/1288; H01L 27/127; H01L 27/1225; H01L 27/3262; H01L 27/3272; H01L 29/7869; H01L 29/78633; H01L 29/66969; H01L 29/24
    See application file for complete search history.

(56) References Cited

U.S. PATENT DOCUMENTS

| | | | |
|---|---|---|---|
| 9,627,461 B2* | 4/2017 | Xie | H01L 29/78618 |
| 10,895,774 B2* | 1/2021 | Yang | G02F 1/136213 |
| 2004/0038501 A1* | 2/2004 | Yamada | H01L 29/78603 |
| | | | 438/486 |
| 2016/0351643 A1* | 12/2016 | Xie | H01L 27/124 |
| 2019/0204668 A1* | 7/2019 | Yang | G09G 3/3258 |

FOREIGN PATENT DOCUMENTS

| | | |
|---|---|---|
| CN | 104078423 A | 10/2014 |
| CN | 107739706 A | 2/2018 |
| KR | 100552937 B1 | 2/2006 |

OTHER PUBLICATIONS

International Search Report dated Aug. 6, 2020, issued in counterpart Application No. PCT/CN2019/115088 (8 pages).
Office Action dated Apr. 2, 2019, issued in counterpart CN Application No. 201810708411.4, with English Translation. (11 pages).

* cited by examiner

THIN FILM TRANSISTOR, FABRICATING METHOD THEREOF, AND DISPLAY APPARATUS

TECHNICAL FIELD

This disclosure relates to display technology, more particularly, to a thin film transistor and a fabricating method thereof, and a display apparatus.

BACKGROUND

At present, active-matrix organic light-emitting diode (AMOLED) products are moving toward high definition, large size and high refreshing rate. This presents high requirements for thin film transistors (TFTs) used in the AMOLED driving circuit. The TFTs currently used in the AMOLED driving circuit mainly include an etch stop layer structure (ESL), a top gate structure (Top Gate), or a back channel etch structure (BCE). Among them, the Top Gate structure can effectively reduce parasitic capacitance, and have better refreshing frequency, a shorter channel and a smaller size, which can meet needs of AMOLED development. Thus, the Top Gate structure shows a great promise for future AMOLED products.

BRIEF SUMMARY

One embodiment of the present disclosure provides a thin film transistor. The thin film transistor may include an active layer; a gate insulating layer on the active layer; and a gate and a plurality of metal films on the gate insulating layer. The plurality of metal films is spaced apart from the gate, and insulated from the gate and the active layer. Because the plurality of metal films can effectively reflect light emitted by the OLED and external light during operation, the effective channel length uniformity and the threshold voltage uniformity of the TFT are significantly improved.

Another embodiment of the present disclosure provides a method of fabricating a thin film transistor. The method may include forming an active layer, a gate insulating layer, and a first metal layer sequentially on a substrate; and patterning the first metal layer to form a gate and a plurality of metal films on at least one side of the gate on the gate insulating layer. The gate may be insulated from the plurality of metal films, and the plurality of metal films may be insulated from the active layer.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the disclosure are apparent from the following detailed description taken in conjunction with the accompanying drawings in which:

DETAILED DESCRIPTION

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-3G. When referring to the figures, like structures and elements shown throughout are indicated with like reference numerals.

In the description of the specification, references made to the term "one embodiment," "some embodiments," and "exemplary embodiments," "example," and "specific example," or "some examples" and the like are intended to refer that specific features and structures, materials or characteristics described in connection with the embodiment or example that are included in at least some embodiments or example of the present disclosure. The schematic expression of the terms does not necessarily refer to the same embodiment or example. Moreover, the specific features, structures, materials or characteristics described may be included in any suitable manner in any one or more embodiments or examples.

For the purpose of surface description hereinafter, as direction-calibrated in the accompanying drawings, the terms "above", "below", "left", "right", "vertical", "horizontal", "top", "bottom" and derivatives thereof shall relate to the present disclosure. The terms "covers", "on", "positioned on", or "positioned on top of" mean that, for example, a first element of a first structure is on a second element of a second structure, wherein an intermediate element such as an intermediate structure may exist between the first element and the second element. The term "contact" means that, for example, the first element of the first structure and the second element of the second structure are connected directly or indirectly, and other elements may exist or not exist at the interface between the two elements.

In addition, the terms "first" and "second" are for illustration purposes only and are not to be construed as indicating or implying relative importance or implied reference to the quantity of indicated technical features. Thus, features defined by the terms "first" and "second" may explicitly or implicitly include one or more of the features. In the description of the present disclosure, the meaning of "plural" is two or more unless otherwise specifically defined.

Unless otherwise defined, all the terms (including the technical and scientific terms) used herein have the same meanings as commonly understood by one of ordinary skill in the art to which the present disclosure is directed. It is also understood that the terms such as defined in the usual dictionary should be interpreted as having the same meanings as the meaning in the context of the relevant technology. The terms should not be interpreted as an idealization or as having extreme meanings, unless they are explicitly defined herein. As employed herein, the statement that two or more parts are "connected" or "coupled" together shall mean that the parts are joined together either directly or joined through one or more intermediate parts.

A numerical range modified by "about" herein means that the upper and lower limits of the numerical range can vary by 10% thereof.

Figure 1A:
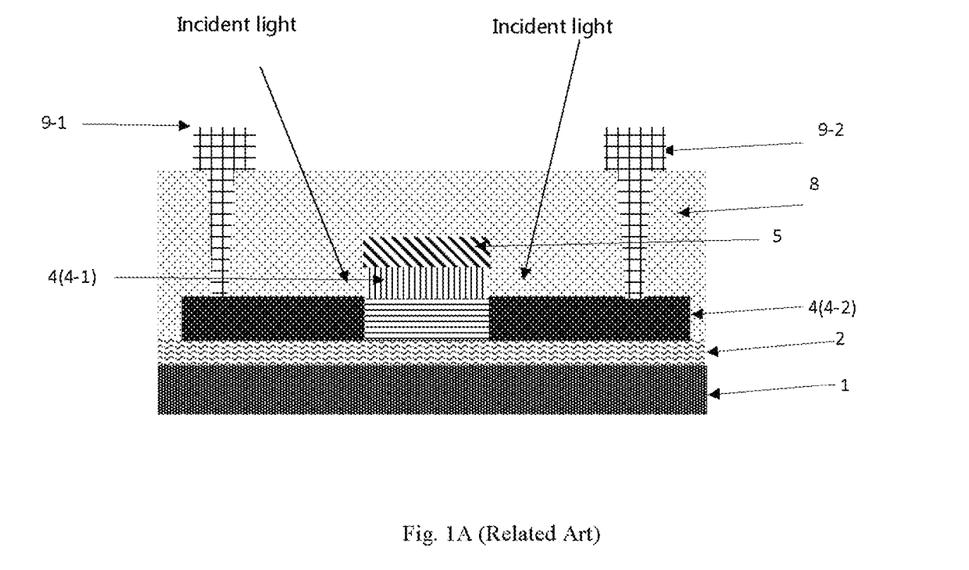
FIG. 1A shows a schematic cross-sectional view of a Top Gate oxide thin film transistor in the related art.

FIG. 1A shows a schematic cross-sectional view of a top gate oxide thin film transistor (TFT) in the related art. As shown in FIG. 1, the oxide TFT includes a buffer layer 2, an active layer 4, a gate insulating layer 5, a gate 6, an interlayer dielectric (ILD) layer 8, a source 9-1, and a drain 9-2 on a substrate 1. The active layer 4 includes a channel active area 4-1 and conductive active areas 4-2 at both sides of the channel active area 4-1. As shown in FIG. 1A, the backplate of the top gate oxide TFT is inevitably irradiated by light emitted by the OLED and external light in actual operational environment. After the irradiation, the active layer in the TFT backplane may generate a plurality of photo-generated carriers, which include, for example, electron hole pairs and ionized oxygen vacancies such as Vo+, Vo2+, etc. These electron hole pairs and ionized oxygen vacancies may drift to the interface of the active layer with the insulating layer under action of an electric field, thereby causing capture or injection phenomena. As a result, a phenomenon of threshold voltage drift may occur.

Figure 1B:
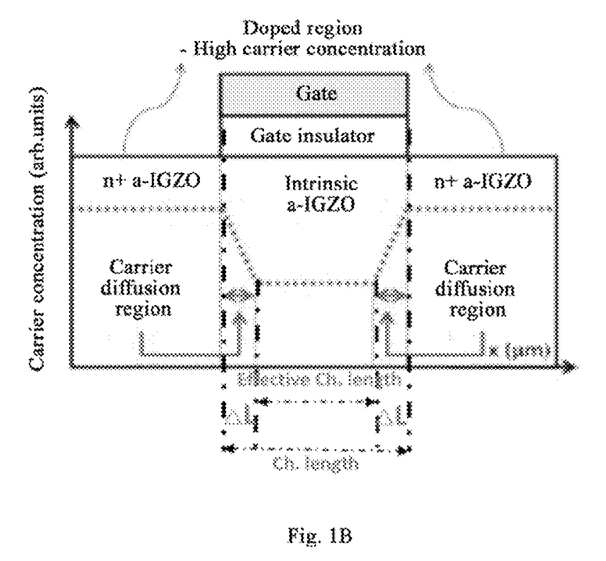
FIG. 1B shows effect of carrier diffusion into a channel active area of the active layer in the related art.

FIG. 1B shows effect of carrier diffusion into the channel active area of the active layer in the related art. Since the channel of the Top Gate structure is short, the uniformity of the threshold voltage of the TFT is susceptible to short channel effect. In particular, during the conductorization process of the active layer such as an indium gallium zinc oxide (IGZO) layer, the influence of the carrier diffusion on the active layer in the channel active area is significant, so that the effective channel length (effective Ch. Length) uniformity is affected. The channel length (Ch. length) has the following relationship with the effective channel length: Ch. Length=Effective Ch. Length+2 $\Delta L$, as shown in FIG. 1B. $2\Delta L$ is the length of the channel active layer into which the carriers diffuse during the conductorization process of the active layer. Therefore, in order to ensure the effective channel length uniformity and further improve the uniformity of the threshold voltage of the TFT, it is necessary to reduce the influence by carrier diffusion on the active layer in the channel active area during the conductorization process of the active layer.

Figure 2A:
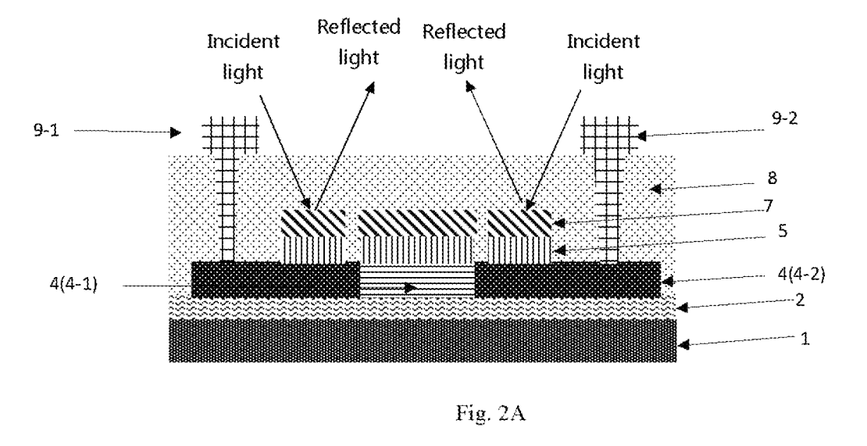
FIG. 2A shows a schematic cross-sectional view of a thin film transistor according to one embodiment of the present disclosure.

FIG. 2A shows a schematic cross-sectional view of a thin film transistor (TFT) according to one embodiment of the present disclosure. As shown in FIG. 2A, the TFT may include a substrate 1, a buffer layer 2 on the substrate 1, an active layer 4 on the buffer layer 2, a gate insulating layer 5 on the active layer 4; and a gate 6 and a plurality of metal films 7 on the gate insulating layer 5. The plurality of metal films 7 may be spaced apart from the gate 6, and distributed on one side or both sides of the gate 6. The plurality of metal films 7 may be insulated from the gate 6 and the active layer 4.

In one embodiment, as shown in FIG. 2A, the active layer 4 includes a channel active area 4-1 and two conductive active areas 4-2 on both sides of the channel active area 4-1, respectively. The gate 6 is formed above the channel active area 4-1 of the active layer 4, and the plurality of metal films 7 is formed above the conductive active areas 4-2 of the active layer 4. In one embodiment, an orthographic projection of the gate 6 on the active layer 4 may be substantially the same as the channel active area 4-1 of the active layer 4. "Substantially" herein means that the difference between the orthographic projection of the gate 6 on the active layer 4 and the channel active area 4-1 of the active layer 4 is less than 10% of the channel active area 4-1 of the active layer 4. An orthographic projection of the plurality of metal films 7 on the active layer 4 is within the conductive active areas 4-2 of the active layer 4. The gate 6 and the plurality of metal films 7 may be directly formed on the gate insulating layer 5. The gate 6 and the plurality of metal films 7 may be made from a same material. For example, like the gate 6, each of the plurality of metal films 7 may include at least one of metals Cu, Al, or Mo. Each of the plurality of metal films 7 may have a thickness in a direction perpendicular to the substrate 1 in a range of about 300 nm to about 1000 nm, preferably about 450 nm to 800 nm.

Figure 2B:
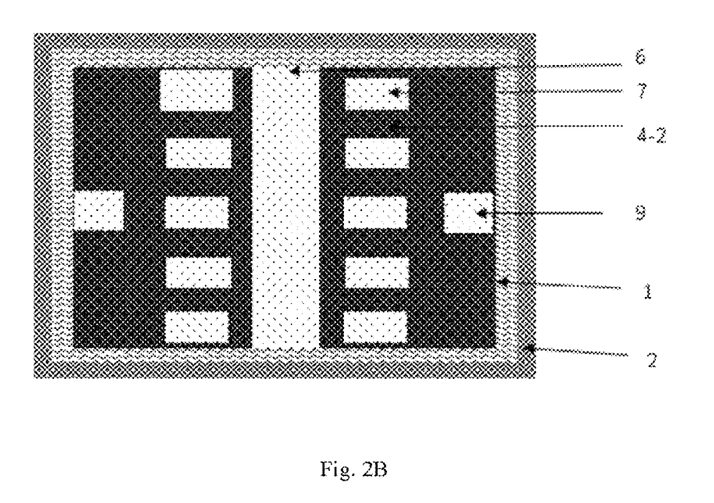
FIG. 2B shows a schematic top view of a thin film transistor according to one embodiment of the present disclosure.

FIG. 2B shows a schematic top view of a thin film transistor according to one embodiment of the present disclosure. As shown in FIG. 2B, the plurality of metal films 7 may include two columns of metal films on both sides of the gate 6, respectively. Each of the plurality of metal films 7 may have a substantially rectangular shape. For example, each of the plurality of metal films 7 may have a substantially rectangular shape having a length in a range of about 4 μm to about 12 μm, such as about 8 μm, and a width in a range of about 2 μm to about 10 μm, such as about 6 μm. An interval distance between two adjacent metal films in the column direction may be in a range of about 1 μm to about 10 μm, preferable about 3 μm to about 8 μm, such as about 5 μm. Each of the plurality of metal films 7 may have a surface area in a range of about 8 $\mu m^2$ to about 120 $\mu m^2$, preferably about 20 $\mu m^2$ to about 100 $\mu m^2$, such as about 50 $\mu m^2$.

In one embodiment, the TFT may further include an interlayer dielectric layer 8 which covers the gate 6, the plurality of metal films 7, the active layer 4, and the buffer layer 2, and a source 9-1 and a drain 9-2 on the interlayer dielectric layer 8. The source 9-1 and the drain 9-2 are electrically connected to the active layer 4 through via holes in the interlayer dielectric layer 8. In one embodiment, an orthographic projection of the plurality of metal films 7 on the active layer 4 is between an orthographic projection of the source 9-1 on the active layer 4 and an orthographic projection of the drain 9-2 on the active layer 4. The plurality of metal films 7 is insulated from the source 9-1 and the drain 9-2.

According to some embodiments of the present disclosure, since the plurality of metal films 7 on at least one side of the gate 6 is usually reflective, the plurality of metal films 7 can effectively reflect light emitted by the OLED and external light, thereby effectively reducing irradiation on the TFT backplate. As a result, the stability of the TFT backplate under operation is significantly improved. Furthermore, the plurality of metal films may effectively reduce the number of carriers generated by the irradiation in the conductive active areas of the active layer. As such, the diffusion of the carriers into the channel active area of the active layer during the conductorization process of the active layer is significantly reduced. Therefore, the influence of carrier diffusion on the channel active area of the active layer during the conductorization process of the active layer is significantly reduced. As a result, the effective channel length uniformity is ensured, and the threshold voltage uniformity of the TFT is significantly improved.

Figure 3A:
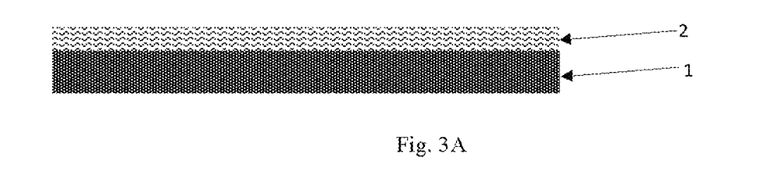
FIGS. 3A-3G show schematic views of a method of fabricating a thin film transistor according to one embodiment of the present disclosure.

FIGS. 3A-3G are schematic views of a method of fabricating a thin film transistor according to one embodiment of the present disclosure. The method of fabricating the thin film transistor may include forming a buffer layer 2 on a substrate 1, as shown in FIG. 3A. The substrate may be a glass substrate. The buffer layer 2 may be formed by a plasma-enhanced chemical vapor deposition (PECVD) method to deposit a first insulating film on the substrate. The first insulating film may be made from silicon oxide or silicon nitride. The ratio of $N_2O$ to $SiH_4$ during the PECVD deposition may be in a range of about 40:1 to about 80:1, and a thickness of the buffer layer may be in a range of about 200 nm to about 400 nm.

Figure 3B:
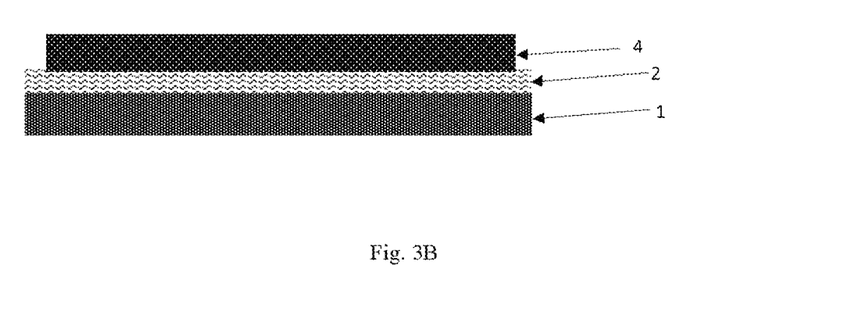

In one embodiment, the method of fabricating the thin film transistor may further include forming an active layer 4 on a surface of the buffer layer 2 away from the substrate 1, as shown in FIG. 3B. Forming the active layer 4 may include depositing an oxide semiconductor film on the buffer layer 2 and patterning the oxide semiconductor film to obtain the active layer 4. The oxide semiconductor film may be made of indium gallium zinc oxide (IGZO) or indium zinc oxide (IZO), etc. A thickness of the active layer 4 may be in a range of about 30 nm to about 80 nm.

Figure 3C:
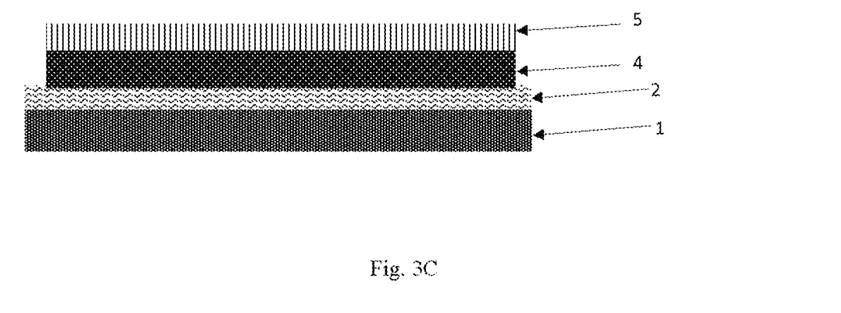

In one embodiment, the method of fabricating the thin film transistor may further include forming a gate insulating (GI) layer 5 on a surface of the active layer 4 away from the substrate 1, as shown in FIG. 3C. The GI layer 5 may be formed by depositing a second insulating film on a surface of the active layer 4 away from the substrate 1 by a PECVD method. The second insulating film may be made from silicon oxide or silicon nitride, etc. The ratio of $N_2O$ to $SiH_4$ during the PECVD deposition may be in a range of about 50:1 to about 70:1. A thickness of the GI layer 5 may be in a range of about 80 nm to about 300 nm.

Figure 3D:
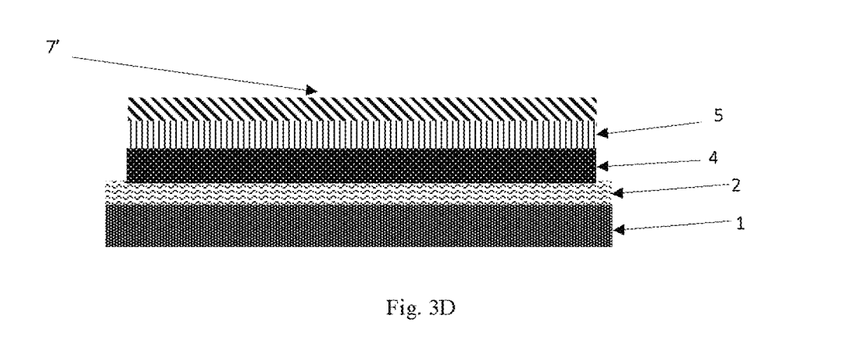
Figure 3E:
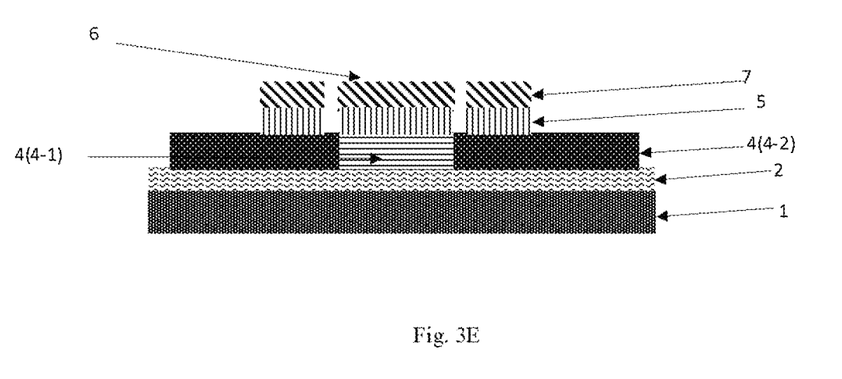

In one embodiment, the method of fabricating the thin film transistor may further include forming a gate 6 and a plurality of metal films 7 on the gate insulating layer 5. The plurality of metal films 7 are spaced apart from one another and distributed on at least one side of the gate 6. In one embodiment, forming the gate 6 and the plurality of metal films 7 may include forming a first metal layer 7' on the gate insulating layer 5, as shown in FIG. 3D. The first metal layer 7' may be formed by, for example, a magnetron sputtering technique. Then, as shown in FIG. 3E, a patterning process is performed on the first metal layer 7' and the GI layer 5 to form the gate 6 and the plurality of metal films 7 on the GI layer 5. In one embodiment, patterning the first metal layer 7' to form the gate 6 and the plurality of metal films 7 on at least one side of the gate 6 may include placing a mask on the first metal layer 7', the mask having a pattern of the gate and the plurality of metal films; and removing the first metal layer and the gate insulating layer exposed by the mask through etching to form the gate 6 and the plurality of metal films 7 on at least one side of the gate. Removing the first metal layer and the gate insulating layer exposed by the mask may be performed through a dry etching method or a wet etching method.

Then, in one embodiment, a conductorization process is performed on the active layer 4 using the gate 6 and the plurality of metal films 7 as a mask. As a result, a part of the active layer 4 which is not covered by the gate 6 is conductorized to form the conductive active areas 4-2 of the active layer 4. A part of the active layer 4 which is covered by the gate 6 is not conductorized due to the effect of the mask by the gate, thereby forming the channel active area 4-1 of the active layer 4. Due to the small area of each of the plurality of metal films 7, the active layer underneath the plurality of metal films 7 may also be conductorized. Therefore, an orthographic projection of the plurality of metal films 7 on the active layer is within the conductive active areas 4-2 of the active layer 4. An orthographic projection of the gate 6 on the active layer is substantially the same as that of the channel active area 4-1 on the active layer. A thickness of the gate 6 may be in a range of about 350 nm to about 800 nm. A thickness of each of the plurality of metal films 7 may also be in a range of about 350 nm to about 800 nm. The plurality of metal films 7 may be insulated from the gate 6 as well as the active layer by the GI layer 5. In one embodiment, performing the conductorization process on the active layer 4 includes conducting a plasma treatment on the active layer 4 using the gate 6 and the plurality of metal films 7 as the mask, thereby forming a channel active area 4-1 underneath the gate 6 and conductive active areas 4-2 on both sides of the channel active area 4-1.

Figure 3F:
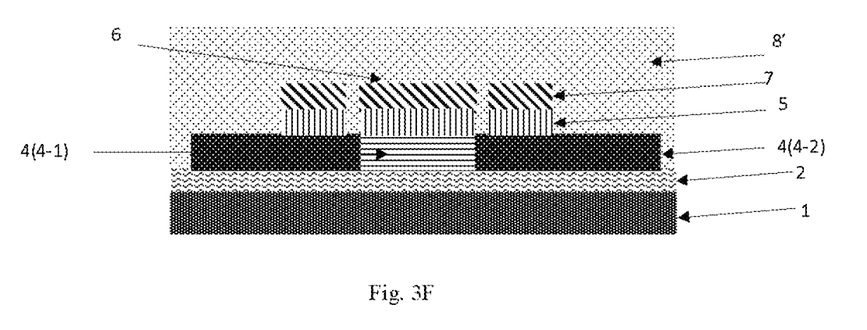

In one embodiment, the method of fabricating the thin film transistor may further include forming an interlayer dielectric (ILD) layer 8, as shown in FIG. 3F. The ILD layer 8 may cover the gate 6, the plurality of metal films 7. The ILD layer 8 may be formed by depositing a third insulating film 8' covering the gate 6, the plurality of metal films 7 by a PECVD method, and patterning the third insulating film 8'. The third insulating film 8' may be made of silicon oxide, silicon nitride, etc. The ratio of $N_2O$ to $SiH_4$ during the PECVD deposition is in a range of about 40:1 to about 80:1. A thickness of the ILD layer 8 is in a range of about 400 nm to about 800 nm.

Figure 3G:
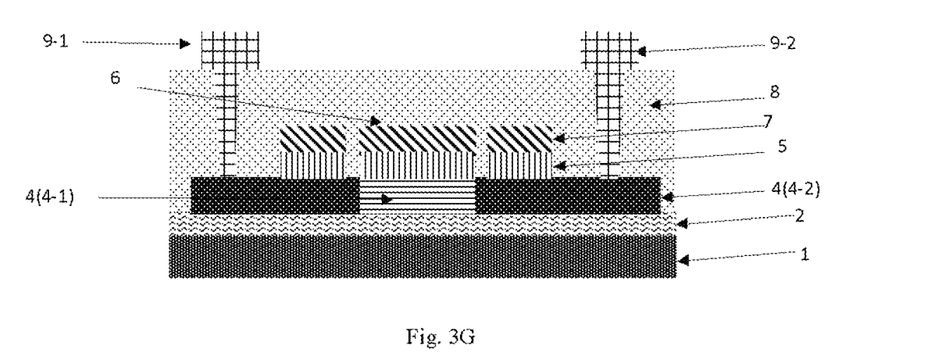

In one embodiment, the method of fabricating the thin film transistor may further include forming a source 9-1 and drain 9-2 on the ILD layer 8, as shown in FIG. 3G. In one embodiment, a second metal film is deposited by a magnetron sputtering technique on the ILD layer 8. The second metal film is then patterned to form a source 9-1 and a drain 9-2. The second metal film may be made of metal Cu, or Al. etc. A thickness of the source and the drain may be in a range of about 400 nm to about 800 nm. In one embodiment, an orthographic projection of the plurality of metal films 7 on the active layer 4 is between an orthographic projection of the source 9-1 on the active layer and an orthographic projection of the drain 9-2 on the active layer 4. The plurality of metal films 7 is insulated from the source 9-1 and the drain 9-2.

In one embodiment, before depositing the second metal film, the method of forming the thin film transistor may further include forming at least two via holes in the third insulating film 8' above the conductive active areas of the active layer. The source and drain are connected to the conductive active areas of the active layer through the via holes in the ILD layer 8.

One embodiment of the present disclosure provides a display apparatus. The display apparatus may include the thin film transistor according to one embodiment of the present disclosure. The display apparatus may be a top emission WOLED apparatus.

The principle and the embodiment of the present disclosure are set forth in the specification. The description of the embodiments of the present disclosure is only used to help understand the method of the present disclosure and the core idea thereof. Meanwhile, for a person of ordinary skill in the art, the present disclosure relates to the scope of the disclosure, and the technical embodiment is not limited to the specific combination of the technical features, and also should covered other technical embodiments which are formed by combining the technical features or the equivalent features of the technical features without departing from the inventive concept. For example, technical embodiments may be obtained by replacing the features described above as disclosed in this disclosure (but not limited to) with similar features.

What is claimed is:
1. A thin film transistor, comprising:
an active layer;
a gate insulating layer on the active layer; and
a gate and a plurality of metal films on the gate insulating layer;
wherein the plurality of metal films is spaced apart from the gate, and insulated from the gate and the active layer;

the plurality of metal films is spaced apart from one another, the gate is above a channel active area of the active layer, and the plurality of metal films is above conductive active areas of the active layer; and an orthographic projection of the plurality of metal films on the active layer is within the conductive active areas of the active layer.

2. The thin film transistor of claim 1, wherein an orthographic projection of the gate on the active layer is substantially the same as the channel active area of the active layer.

3. The thin film transistor of claim 1, wherein the gate and the plurality of metal films are made of a same material.

4. The thin film transistor of claim 1, wherein the gate and the plurality of metal films are formed by a same patterning process.

5. The thin film transistor of claim 1, wherein each of the plurality of metal films has a substantially rectangular shape, and the plurality of metal films comprises two columns of metal films on both sides of the gate, respectively.

6. The thin film transistor of claim 1, wherein each of the plurality of metal films comprises at least one of metals Cu, Al or Mo.

7. The thin film transistor of claim 1, wherein each of the plurality of metal films has a thickness in a range of about 300 nm to about 1000 nm.

8. The thin film transistor of claim 1, wherein each of the plurality of metal films has a surface area in a range of about 8 $\mu m^2$ to about 120 $\mu m^2$.

9. The thin film transistor of claim 1, further comprising a source and a drain, wherein the orthographic projection of the plurality of metal films on the active layer is between an orthographic projection of the source on the active layer and an orthographic projection of the drain on the active layer, and the plurality of metal films is insulated from the source and the drain.

10. A display apparatus, comprising the thin film transistor according to claim 1.

11. A method of fabricating a thin film transistor, comprising:

forming an active layer, a gate insulating layer, and a first metal layer sequentially on a substrate; and patterning the first metal layer to form a gate and a pluarity of metal films on at least one side of the gate, wherein the plurality of metal films is insulated from the gate and the active layer;

patterning the first metal layer to form the gate and the pluarity of metal films on at least one side of the gate comprises:

placing a mask on the first metal layer, the mask having a pattern of the gate and the pluarity of metal films; and removing the first metal layer and the gate insulating layer exposed by the mask through etching to form the gate and the pluarity of metal films on at lesat one side of the gate.

12. The method of fabricating a thin film transistor of claim 11, wherein the first metal layer is formed on the gate insulating layer by a magnetron sputtering technique.

13. The method of fabricating a thin film transistor of claim 11, wherein removing the first metal layer and the gate insulating layer exposed by the mask is performed through a dry etching method or a wet etching method.

14. The method of fabricating a thin film transistor of claim 11, further comprising:

performing a conductorization process on the active layer using the gate and the plurality of metal films as a mask.

15. The method of fabricating a thin film transistor of claim 14, wherein performing the conductorization process comprises conducting a plasma treatment on the active layer using the gate and the plurality of metal films as the mask, thereby forming a channel active area of the active layer underneath the gate and conductive active areas on both sides of the channel active area.

16. The method of fabricating a thin film transistor of claim 11, further comprising:

forming an interlayer dielectric layer covering the active layer, the gate, and the plurality of metal films; and forming a source and a drain on the interlayer dielectric layer, wherein an orthographic projection of the plurality of metal films on the active layer is between an orthographic projection of the source on the active layer and an orthographic projection of the drain on the active layer, and the plurality of metal films is insulated from the source and the drain.

17. The method of fabricating a thin film transistor of claim 16, before forming the source and the drain on the interlayer dielectric layer, further comprising forming two via holes in the interlayer dielectric layer, wherein the source and the drain are electrically connected to the active layer through the two via holes, respectively.

* * * * *